United States Patent [19]

Sato et al.

[11] Patent Number: 5,563,993
[45] Date of Patent: Oct. 8, 1996

[54] LOGIC SIMULATOR SYSTEM USING BOTH FREE-FORMAT DISPLAY FORMAT AND STREAM DISPLAY FORMAT

[75] Inventors: Akiko Sato; Kazumasa Nakamura, both of Kawasaki, Japan

[73] Assignee: Fujitsu Limited, Japan

[21] Appl. No.: 113,817

[22] Filed: Aug. 31, 1993

[30] Foreign Application Priority Data

Mar. 17, 1993 [JP] Japan ................................ 5-056854

[51] Int. Cl.$^6$ .................................................. G06T 11/00
[52] U.S. Cl. ........................ 395/140; 395/155; 395/161; 395/919; 395/921
[58] Field of Search ........................... 395/140, 155–161, 395/500, 919–921; 371/23; 364/57, 488:14 491

[56] References Cited

U.S. PATENT DOCUMENTS

| 5,146,460 | 9/1992 | Ackerman et al. | 371/23 |
| 5,327,361 | 7/1994 | Long et al. | 364/57 |
| 5,396,615 | 3/1995 | Tani | 395/500 |

*Primary Examiner*—Almis R. Jankus
*Attorney, Agent, or Firm*—Staas & Halsey

[57] ABSTRACT

In a logic simulation system, a first management table manages time-series data of signal values for each signal terminal, constituting logic simulation result information. A setting unit sets one or a plurality of display formats for logic simulation result information, permitting a desired display format, through an interactive communication with users. A second management table for manages a display manner of a free-format display format, set by the setting unit. A third management table manages a display format of a stream display format, which is a time-series display format of logic simulation result information. A result display control unit specifies logic simulation result information at the present display time in the free-format display format, with reference to respective management data in the first and second management tables to thereby display the specified logic simulation result information, and for specifying logic simulation result information, including the present display time, in the stream display format with reference to the management data in the first management table and management data in the third management table. The system thus exactly displays logic simulation result information required by users, and thus effectively executes a logic simulation analysis.

13 Claims, 18 Drawing Sheets

Fig. 4A

```
DATA1=
DATA2=

RESULT=
```

Fig. 4B

```
REG1=
REG2=
```

Fig. 19

| | | t | |
|---|---|---|---|
| | 000<br>1 2 3 | 1 | |
| DATAB0<br>↑<br>② | 0 0 0 1 1 1 1 1 2 | 2 | 2 2 2 2 2 |

DATA1=010
DATA2=010

RESULT=100

REG1=00000000
REG2=0000F000

Fig. 20

DATA1=010
DATA2=010

RESULT=100

REG1=00000000
REG2=0000F000

| | | t | |
|---|---|---|---|
| | 000<br>1 2 3 | 1 | |
| DATAB0 | 0 0 0 1 1 1 1 1 2 | 2 | 2 2 2 2 2 |
| ③ { DATAB1 | 0 0 0 0 0 0 0 0 0 | 0 | 0 0 0 0 0 |
| DATAB2 | 0 0 0 0 0 0 0 0 0 | 0 | 0 0 0 0 0 |
| DATAB3 | 0 0 0 0 0 0 0 0 1 | 1 | 1 1 1 1 1 |
| DATAB4 | 0 0 0 1 1 1 1 1 0 | 0 | 0 0 0 0 0 |

Fig. 21

| | | | | |
|---|---|---|---|---|
| DATA1=010 | | REG1=00000000 | | |
| DATA2=010 | | REG2=0000F000 | | |
| RESULT=100 | | | | |

| | 0 0 0<br>1 2 3 | | 1<br>1 | |
|---|---|---|---|---|
| DATAB  | 0 0 0 1 1 1 1 1 1 2 | 2 | 2 2 2 2 2 |
| DATAB5 | 0 0 0 0 0 0 0 0 0 2 | 2 | 2 2 2 2 2 |
| DATAB6 | 0 0 0 0 0 0 0 0 0 2 | 2 | 2 2 2 2 2 |

④

LOGIC SIMULATOR SYSTEM USING BOTH FREE-FORMAT DISPLAY FORMAT AND STREAM DISPLAY FORMAT

BACKGROUND OF THE INVENTION

1. Field of the Invention

The present invention relates to a logic simulation system, more particularly, to a logic simulation system which adopts a constitution that simulates logic circuits to thereby display the logic simulation result information on a display.

In recent years, with respect to logic circuits provided in a computer system, or the like, high degree of integration thereof has been increasingly developed. With the development, time required for an analysis of the logic circuits has been prolonged. In view of the fact, it has been demanded to realize a logic simulation system by which it is possible to simply carry out a verification of the operation of designed logic circuits and an analysis of erroneous operation thereof.

2. Description of the Related Art

A conventional logic simulation system has adopted a constitution which displays logic simulation result information on a display according to a free-format display format, or a constitution which displays logic simulation result information on a display according to a stream display format.

Namely, there has been adopted a free-format display format in which logic simulation result information at designated times are displayed according to a user-defined display format, or a stream display format in which logic simulation result information at signal terminals are displayed in the form along the passage of time.

However, both of the display formats have a merit and a demerit, respectively, as described below.

A constitution which displays logic simulation result information according to the free-format display format has an advantage in that signal values for signal terminals constituting the logic simulation result information can be displayed in great numbers on a display. However, it is impossible to grasp the flow of time with respect to the signal values, and thus a problem occurs in that, when an error is found in logic circuits, it takes a long time to analyze a cause for the error.

On the other hand, a constitution which displays logic simulation result information according to the stream display format has an advantage in that, when an error is found in logic circuits, it is possible to easily analyze a cause for the error. This is because time-series data of the signal values for signal terminals are displayed. However, due to the display of the time-series data, the number of signal terminals which can be displayed at one time on a display is relatively decreased. As a result, a problem occurs in that it is necessary to troublesomely repeat a display for another image plane, and thus it takes a long time to analyze the logic circuits.

SUMMARY OF THE INVENTION

An object of the present invention is to provide a novel logic simulation system by which it is possible to exactly display logic simulation result information required by users, and thus to effectively execute a logic simulation analysis.

According to the present invention, there is provided a logic simulation system which adopts a constitution that simulates logic circuits to thereby display logic simulation result information on a display, the logic simulation system including: a first management table for managing time-series data of signal values for each signal terminal, constituting logic simulation result information; a setting means for setting one or a plurality of display formats for logic simulation result information, permitting an arbitrary display manner, through an interactive communication with users; a second management table for managing a display manner of a free-format display format set by the setting means; a third management table for managing a display manner of a stream display format which is a time-series display format of logic simulation result information; and a result display control means for specifying logic simulation result information at the present display time in the free-format display format with reference to management data in the first management table and management data in the second management table, to thereby display the specified logic simulation result information on the display, and for specifying logic simulation result information, including the present display time, in the stream display format with reference to the management data in the first management table and management data in the third management table, to thereby display the specified logic simulation result information on the display.

BRIEF DESCRIPTION OF THE DRAWINGS

Other objects and features of the present invention will be described hereinafter in detail by way of preferred embodiments with reference to the accompanying drawings, in which:

FIGS. 4 and 4B are diagrams illustrating an example of free-format display format;

FIGS. 13A to 13D are flowcharts representing an example of the processing executed by the signal terminal display process;

FIG. 19 is a diagram illustrating a third example of the display processing of logic simulation result information;

FIG. 20 is a diagram illustrating a fourth example of the display processing of logic simulation result information; and FIG. 21 is a diagram illustrating a fifth example of the display processing of logic simulation result information.

DESCRIPTION OF THE PREFERRED EMBODIMENTS

Throughout the description, identical references used in connection with the drawings indicate like constituent elements, and thus the repetition of explanation thereof is omitted.

Figure 1:
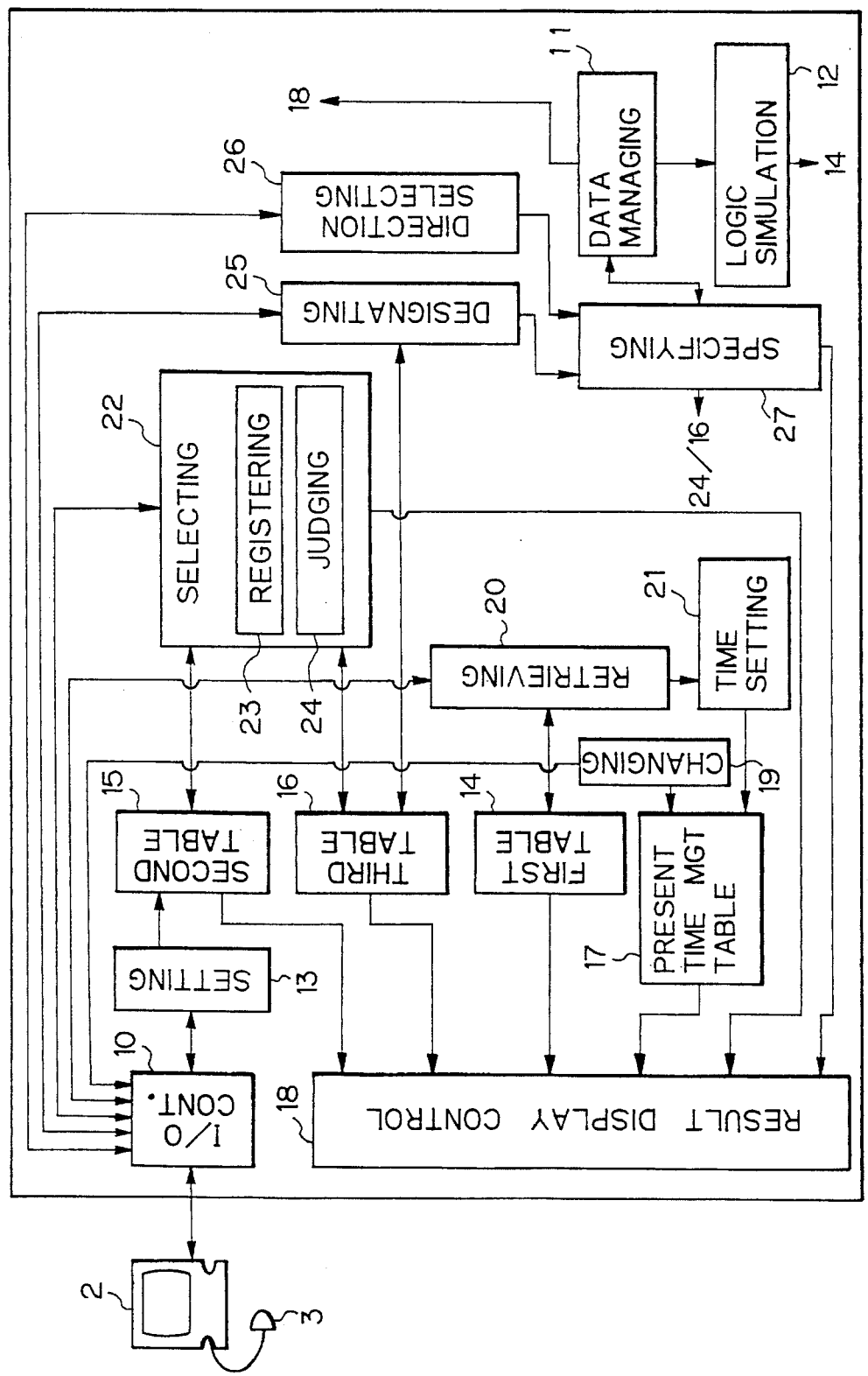
FIG. 1 is a diagram illustrating the fundamental constitution of the logic simulation system according to the present invention.

FIG. 1 illustrates the fundamental constitution of the logic simulation system according to the present invention.

In the illustration, reference 1 denotes a logic simulation system embodying the present invention; reference 2 denotes a terminal provided in the logic simulation system 1; and reference 3 denotes an input unit such as a keyboard or mouse, attached to the terminal 2.

The logic simulation system 1 according to the present invention includes an input/output (I/O) control means 10, a logic circuit data information managing means 11, a logic simulation means 12, a setting means 13, a first management table 14, a second management table 15, a third management table 16, a present display time management table 17, a result display control means 18, a changing means 19, a retrieving means 20, a time setting means 21, a selecting means 22, a registering means 23, a judging means 24, a designating means 25, a direction selecting means 26, and a specifying means 27.

The input/output control means 10 executes processings for the interface with the terminal 2. The logic circuit data information managing means 11 manages logic circuit data information which is an object of the logic simulation. The logic simulation means 12 executes logic simulations for logic circuits managed by the logic circuit data information managing means 11, and registers the logic simulation result information into the first management table 14. The setting means 13 sets one or a plurality of display formats for the logic simulation result information, permitting an arbitrary display format, through an interactive communication with users.

The first management table 14 manages time-series data of signal values for each signal terminal, constituting the logic simulation result information. The second management table 15 manages a display format of the user-defined free-format display format set by the setting means 13. The third management table 16 manages a display format of the system-defined stream display format which is a time-series display format of the logic simulation result information. The present display time management table 17 manages the present display time at which a logic simulation is executed.

The result display control means 18 uses management data in the first management table 14, the second management table 15, the third management table 16 and the present display time management table 17, and displays the logic simulation result information on the display of the terminal 2.

The changing means 19 updates the present display time managed by the present display time management table 17, through an interactive communication with users. The retrieving means 20 retrieves management data in the first management table 14 upon receipt of the request for retrieval from users, and thus retrieves a logic simulation time, to a value at which a signal value for a designated signal terminal is changed. The time setting means 21 sets the logic simulation time retrieved by the retrieving means 20 into the present display time management table 17, as the present display time.

The selecting means 22, through an interactive communication with users, selects a signal value from the free-format display format displayed on the display of the terminal 2, and selects a signal terminal from the stream display format displayed on the display. When the selecting means 22 selects a signal value from the free-format display format, the registering means 23 registers a signal terminal indicated by the signal value in the third management table 16. When the selecting means 22 selects a signal terminal from the stream display format, the judging means 24 judges whether or not the signal terminal is registered in the second management table 15, and judges whether or not a signal terminal specified by the specifying means 27 is registered in the second management table 15.

The designating means 25 designates a signal terminal from the stream display format displayed on the display, through an interactive communication with users. The direction selecting means 26 selects either a preceding stage direction or a following stage direction, through an interactive communication with users. When the designating means 25 designates a signal terminal, the specifying means 27 refers to the logic circuit data information in the logic circuit data information managing means 11, specifies one or a plurality of signal terminals related to the designated signal terminal and pertaining to a direction selected by the direction selecting means 26, and registers the specified signal terminals in the third management table 16.

In the above constitution, the result display control means 18 refers to the management data in the first management table 14 and the second management table 15, specifies signal values at the present display time, of signal terminals in the free-format display format, and specifies logic simulation result information at the present display time in the free-format display format. Also, the result display control means 18 refers to the management data in the first management table 14 and the third management table 16, specifies time-series data of signal values, including the present display time, of signal terminals in the stream display format, and specifies logic simulation result information, including the present display time, in the stream display format. Then, the specified logic simulation result information in the free-format display format and the specified logic simulation result information in the stream display format are simultaneously displayed on the display of the terminal 2.

When the result display control means 18 displays the logic simulation result information of the stream display format, it can display the information in a display manner by which the present display time is distinguishable. Also, when the present display time is changed by the changing means 19 or the time setting means 21, the result display control means 18 can display a portion at which a change in signal values occurs in the free-format display format, in a display manner by which the portion is distinguishable. Furthermore, the result display control means 18 can display signal values of logic simulation result information, by hexadecimal, to thereby collectively display signal values for a plurality of signal terminals.

Also, when the selecting means 22 selects a signal value from the free-format display format through an interactive communication with users, the result display control means 18 can display a time-series logic simulation result information of a signal terminal indicated by the signal value, in the stream display format on the display. At this time, the result display control means 18 can display the signal value of the stream display format, in a display manner by which the signal value is distinguishable. Furthermore, when the selecting means 22 selects a signal terminal from the stream display format through an interactive communication with users, and when the judging means 24 judges that the selected signal terminal is allocated to the free-format display format, the result display control means 18 can display signal values of the free-format display format of the signal terminal, in a display manner by which the signal values are distinguishable.

Also, when the designating means 25 designates a signal terminal from the stream display format through an interactive communication with users, the result display control means 18 can display a time-series logic simulation result information of the signal terminal specified by the specifying means 27, in the stream display format on the display. At this time, the result display control means 18 can display signal values of the stream display format, in a display manner by which the signal values are distinguishable. Furthermore, when the judging means 24 judges that the signal terminal specified by the specifying means 27 is allocated to the free-format display format, the result display control means 18 can display signal values of the free-format display format of the signal terminal, in a display manner by which the signal values are distinguishable.

As explained above, the logic simulation system 1 according to the present invention is based on the fundamental constitution in which both logic simulation result information represented by a free-format display format which can display signal values for a great number of signal terminals, and logic simulation result information represented by a stream display format, which can grasp the passage of time with respect to signal values for signal terminals, are simultaneously displayed on an identical display. Namely, the logic simulation system 1 adopts the constitution in that required logic simulation result information of a stream display format is called from display data of a free-format display format, and in that required logic simulation result information of a free-format display format is called from display data of a stream display format, and further in that required logic simulation result information of a stream display format is called from display data of a stream display format. As a result, it is possible for users to effectively execute analyses based on the logic simulation result information.

Next, a preferred embodiment of the present invention will be explained in detail.

Figure 2:
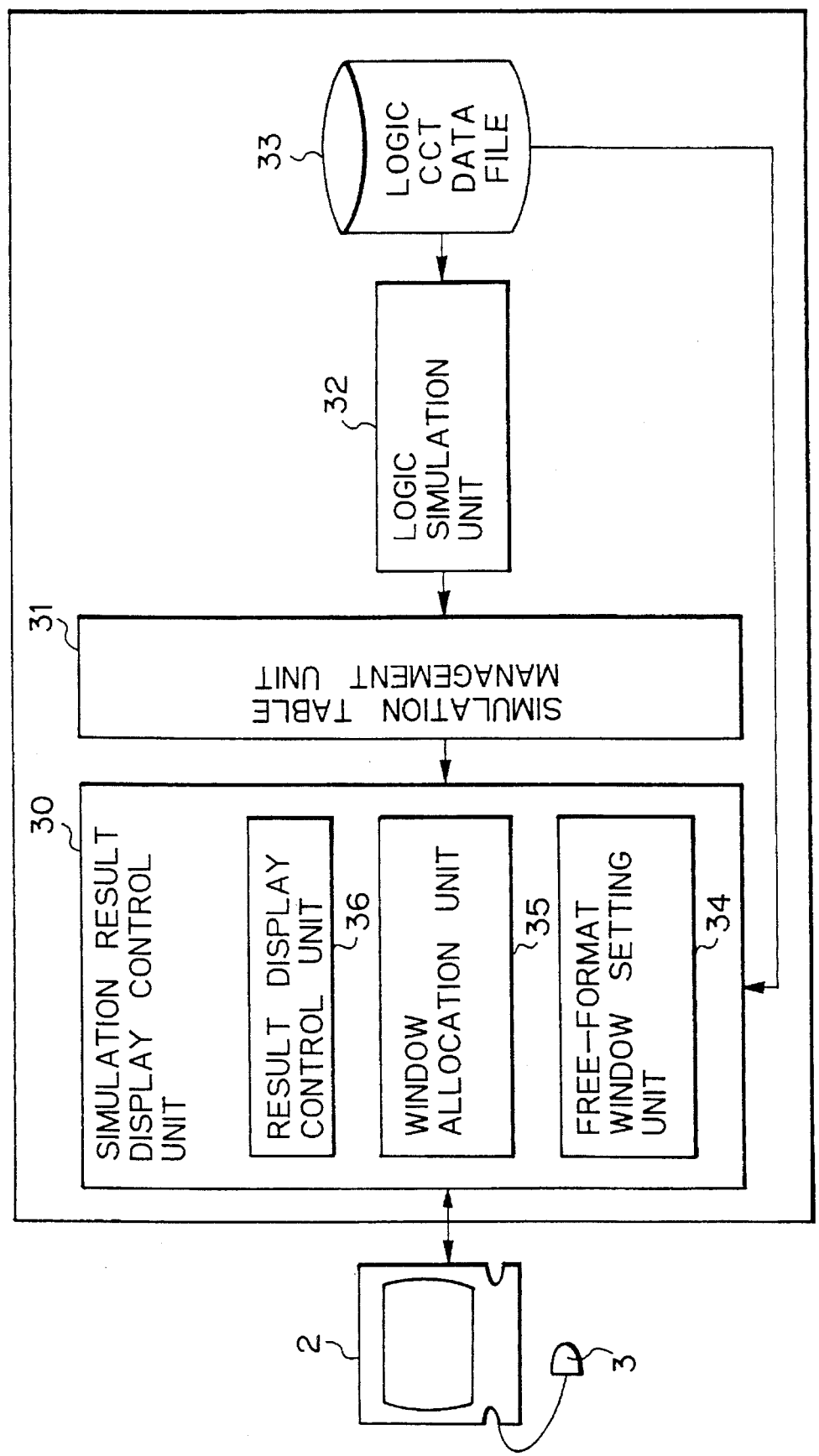
FIG. 2 is a diagram illustrating the constitution of an embodiment of the present invention.

FIG. 2 illustrates the constitution of an embodiment of the logic simulation system 1 according to the present invention.

The logic simulation system of the present embodiment includes a simulation result display control unit 30, a simulation table management unit 31, a logic simulation unit 32, and a logic circuit data file 33. The simulation result display control unit 30 includes a free-format window setting unit 34, a window allocation unit 35, and a result display control unit 36.

Figure 3:
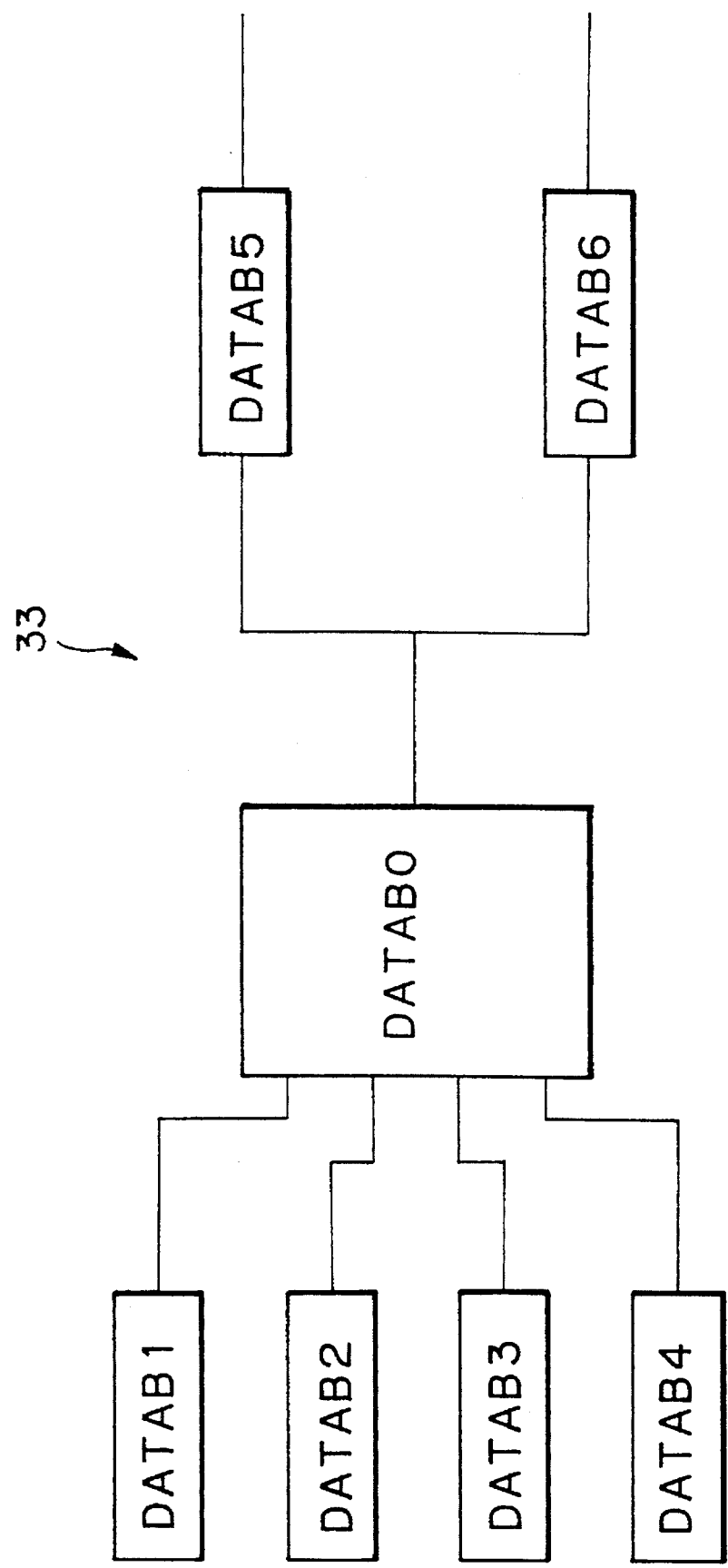
FIG. 3 is an explanatory diagram of management data in the logic circuit data file.

The logic simulation unit 32 executes a logic simulation processing of logic circuits, and the logic circuit data file 33 manages logic circuit data information as shown in FIG. 3, which is an object of the logic simulation by the logic simulation unit 32. In FIG. 3, reference DATABi (i=0 to 6) denotes a user-defined signal terminal name. In practice, the logic circuit data information is represented by signal terminal numbers. Accordingly, the logic circuit data file 33 manages the relationship between the signal terminal numbers and the user-defined signal terminal names.

As explained in connection with FIG. 1, the logic simulation system 1 according to the present invention is based on the fundamental constitution in which logic simulation result information represented by a free-format display format and logic simulation result information represented by a stream display format are simultaneously displayed, using a multi-window, on an identical display. Display manners in the stream display format are prepared in advance in the system, and display manners in the free-format display format can be arbitrarily defined by users.

Figures 4A, 4B:
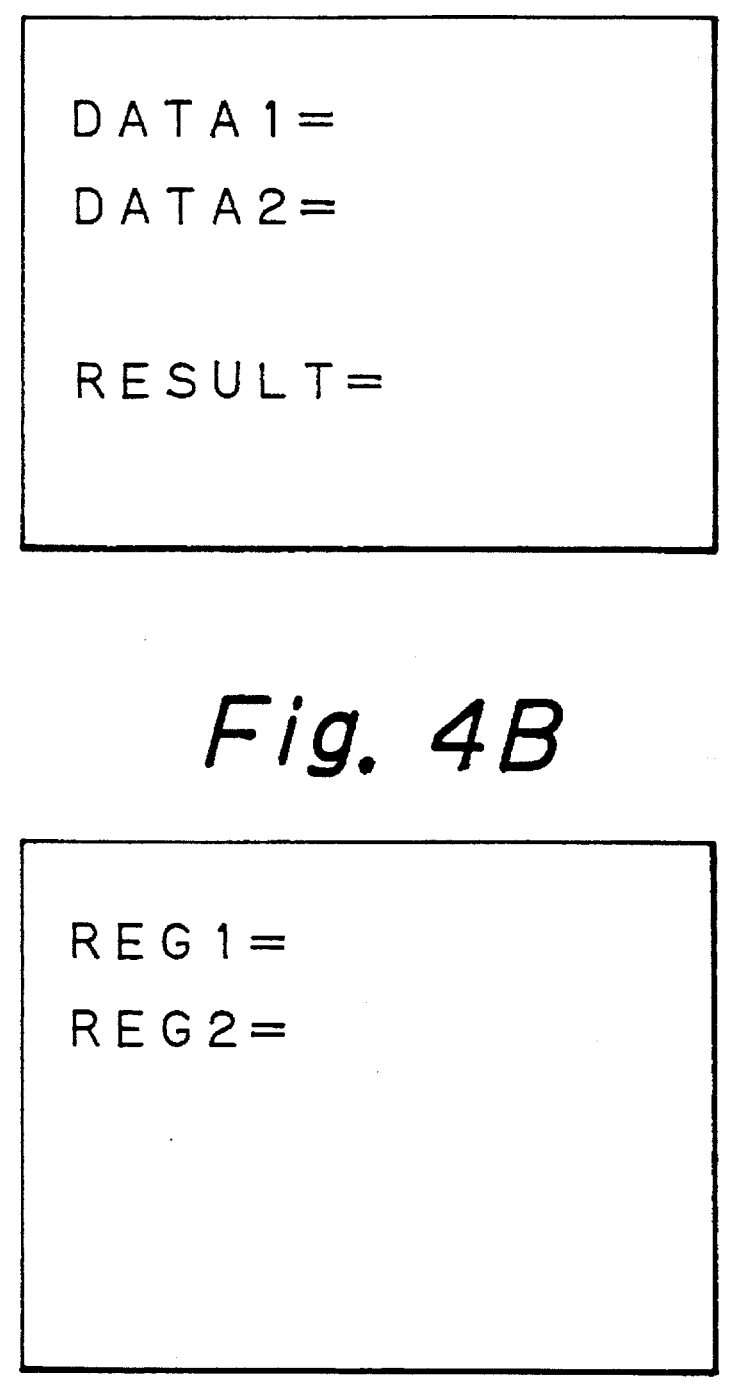

Setting processing of the display manners in the free-format display format is controlled by the free-format window setting unit 34 shown in FIG. 2. Namely, when a user designates a display format indicating a signal terminal, a signal value for the signal terminal, and a display position at which the signal value is displayed, by way of the display of the terminal 2, the free-format window setting unit 34 transduces the designated display format into an internal data format of the logic simulation system 1, and thus sets one or a plurality of free-format display formats as shown in FIGS. 4A and 4B.

Note, both the stream display format and the free-format display format permit a plurality of signal terminals to be defined as one group. An example is shown below.

GROUP #GRP1 ('DATA0','DATA1','DATA2', 'DATA3'); This group defines four signal terminals DATAi (i=0 to 3) as a group name "#GRP1". Using the group name, it is possible to designate and display signal values of the four signal terminals DATAi, in the form of binary or hexadecimal. According to the designation, the signal values of the four signal terminals DATAi can be displayed in the form of binary, such as "0011", or in the form of hexadecimal, such as "3".

The simulation table management unit 31 shown in FIG. 2 manages various table data required for the display processing of logic simulation result information.

Figure 5:
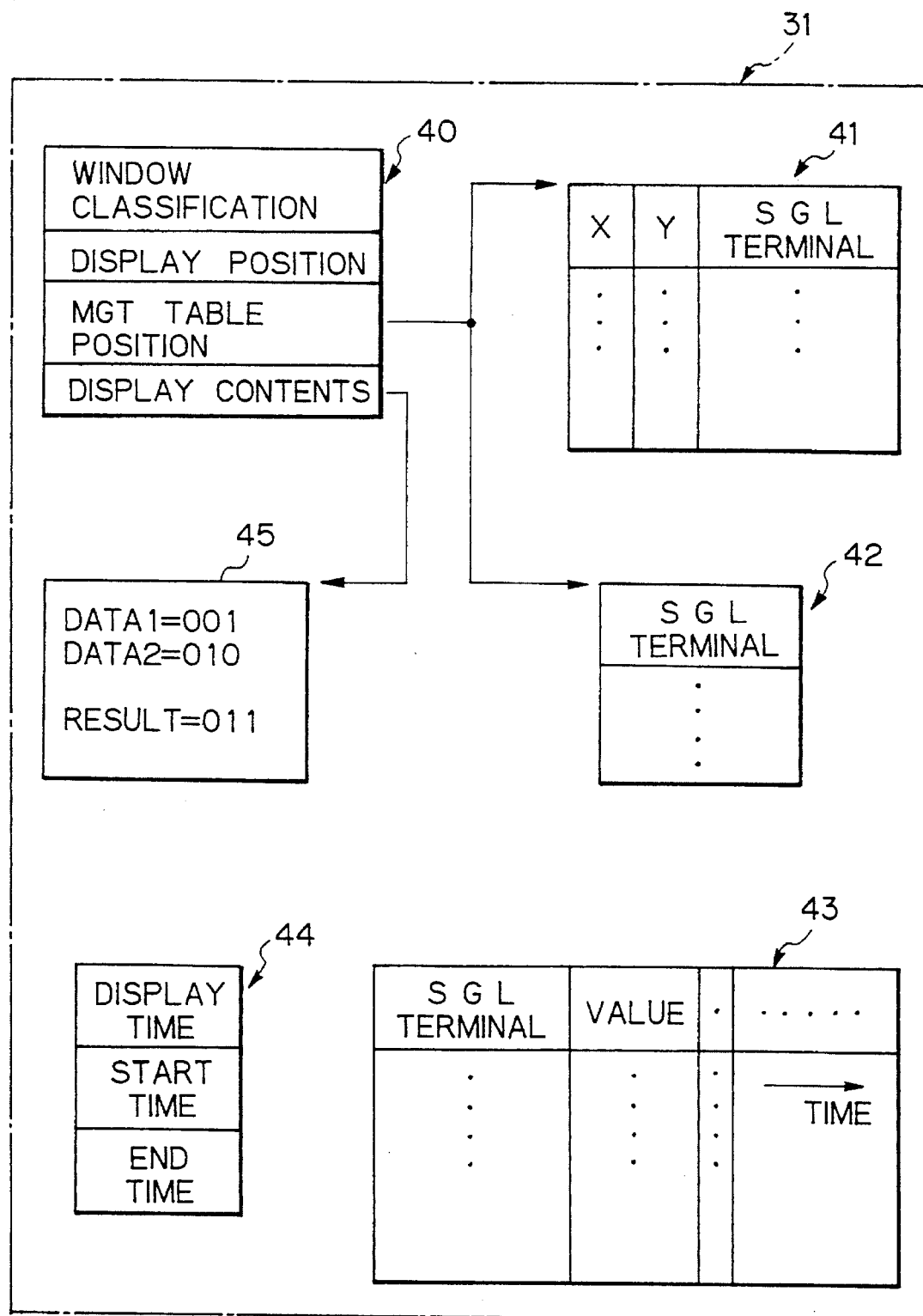
FIG. 5 is a diagram illustrating an example of management data in the simulation table management unit.

FIG. 5 illustrates an example of management data in the simulation table management unit 31.

In the illustration, reference 40 denotes a one-window management table, which is used for managing attribute information characteristic of windows displayed on the display of the terminal 2. Concretely, the table 40 contains a window classification entry for managing whether an allocated window is a free-format window or a stream window; a display position entry for managing a display position of the allocated window; a management table position entry for managing a development position of display manner data of the allocated window; and a display content entry for managing a development position of display content data of a previously specified free-format window.

Reference 41 denotes a free-format window management table, which is used for managing display manner data of a free-format display format set by the free-format window setting unit 34. Concretely, the table 41 manages display manner data concerning signal terminals, signal values for the signal terminals, and display positions at which the signal values are displayed. When the above one-window management table 40 manages a free-format window classification in the window classification entry, it manages a development position in the free-format window management table 41 which manages the allocated free-format display manner data.

Reference 42 denotes a stream window management table, which is used for managing display manner data of the system-defined stream display format. Concretely, the table 42 manages display manner data concerning signal terminals and signal values therefor to be displayed on the first row, the second row, and the like. When the above one-window management table 40 manages a stream window classification in the window classification entry, it manages a development position in the stream window management table 42 which manages the allocated stream display manner data.

Reference 43 denotes a signal value table, which is used for managing logic simulation result information of the logic simulation unit 32. Concretely, the table 43 manages time-series data of signal values for each signal terminal. Reference 44 denotes a time management table, which is used for managing a start time and an end time of logic simulation, and a logic simulation display time indicating the present display time. Reference 45 denotes a display content table, which is used for re-use of the display content data of a previously specified free-format window. The above one-window management table 40 manages a development position in the display content table 45 in the display content entry.

The window allocation unit 35 shown in FIG. 2 effects a processing for allocating stream windows and free-format windows on the display of the terminal 2, through an interactive communication with users. For example, when a user requests a display of two kinds of free-format window, the window allocation unit 35 displays the system-defined stream window on the display, and also displays two window frames for free-format window prepared as a default. Then, through an interactive communication with the user, the window allocation unit 35 allocates free-format display formats according to the user's request, to the two window frames. This also applies to the case where two or more kinds of free-format window are displayed.

Also, the window allocation unit 35 has a function of changing the size or arrangement of each window frame for free-format window, through an interactive communication with users. Furthermore, when a user requests a display of a great number of free-format windows which cannot be displayed at one time, the window allocation unit 35 also has a function of effecting the display according to an overlapped display method.

The result display control unit 36 shown in FIG. 2 effects a processing of using the management data in the simulation table management unit 31 to thereby specify logic simulation result information which is an object of display, and of displaying the specified logic simulation result information on the display of the terminal 2 according to a window form designated by the window allocation unit 35.

Figure 6:
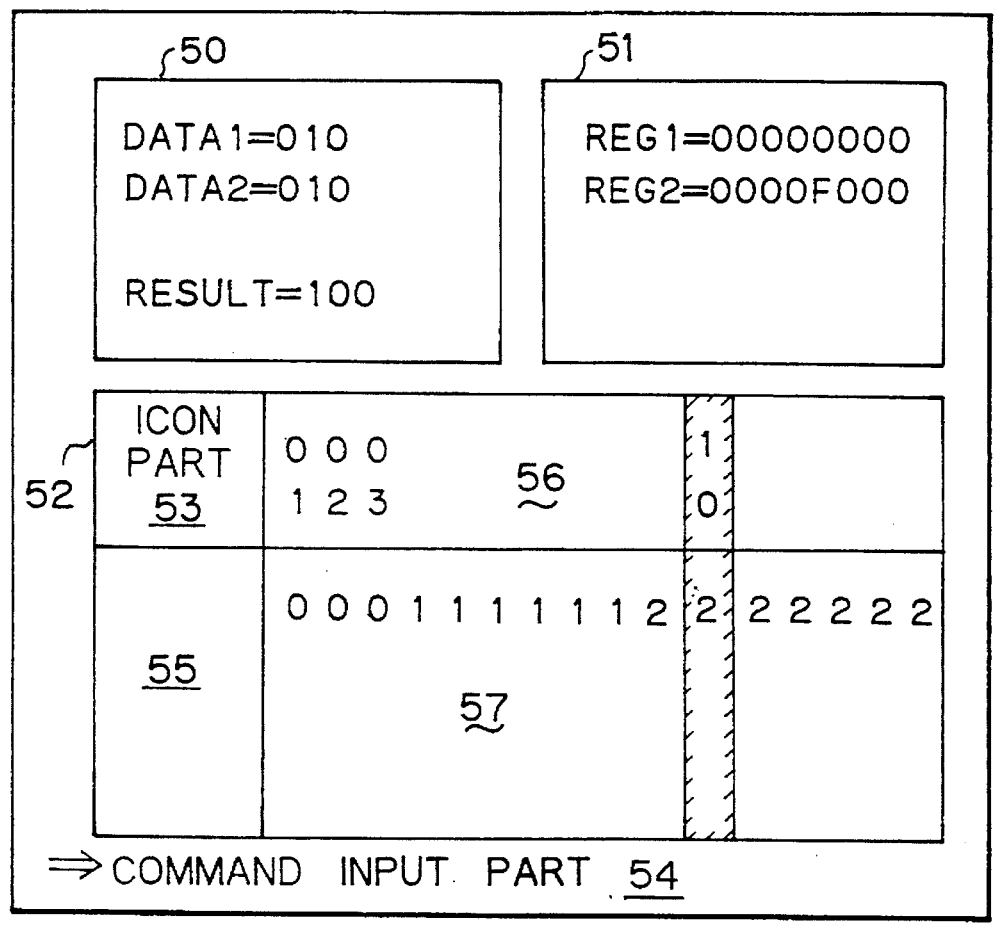
FIG. 6 is a diagram illustrating a display example of logic simulation result information.

FIG. 6 illustrates a display example of logic simulation result information displayed by the result display control unit 36. In the illustration, references 50 and 51 denote free-format windows; reference 52 denotes a stream window; reference 53 denotes an icon part; and reference 54 denotes a command input part.

The stream window 52 is constituted by a signal terminal name display part 55 for displaying signal terminal names, a time display part 56 for displaying logic simulation times, and a signal value display part 57 for displaying signal values for the signal terminals. With respect to logic simulation display times managed by the time management table 44 and signal values, corresponding to the logic simulation display times, of the signal value display part 57, the same are displayed in a changed color as shown by a hatched portion.

Figure 7:
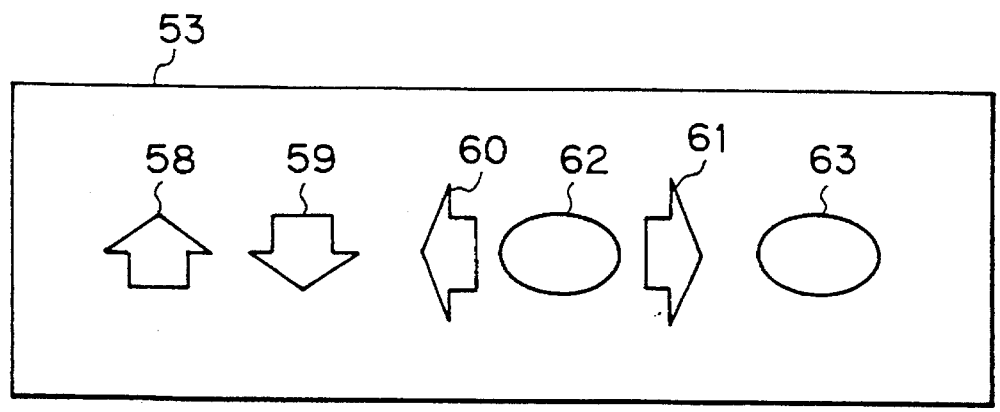
FIG. 7 is a diagram illustrating the arrangement of keys in the icon part.

On the other hand, as shown in FIG. 7, the icon part 53 includes an up-scroll key 58 for scrolling the signal terminal name display part 55 and the signal value display part 57 upward; a down-scroll key 59 for scrolling the signal terminal name display part 55 and the signal value display part 57 downward; a left-scroll key 60 for scrolling the signal terminal name display part 55 leftward when the part 55 is an object of scrolling, and for scrolling the time display part 56 and the signal value display part 57 leftward when the parts 56 and 57 are objects of scrolling; a right-scroll key 61 for scrolling the signal terminal name display part 55 rightward when the part 55 is an object of scrolling, and for scrolling the time display part 56 and the signal value display part 57 rightward when the parts 56 and 57 are objects of scrolling; a scroll-object selection button 62 for selecting which of the signal terminal name display part 55, or the time display part 56 and the signal value display part 57, as an object of scrolling; and a trace direction selection button 63 for selecting the trace direction of each signal terminal.

Figure 8:
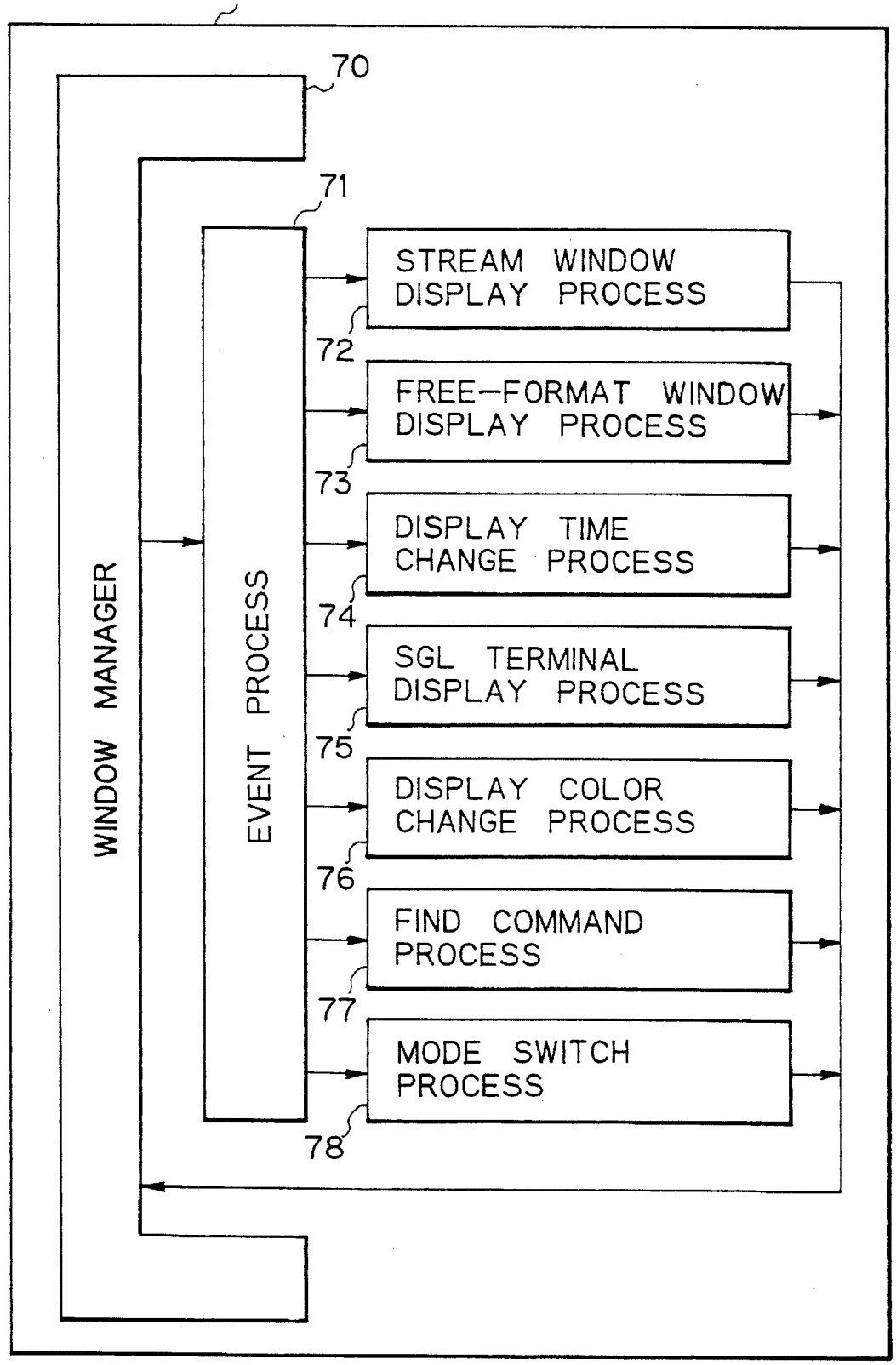
FIG. 8 is a diagram illustrating an example of the program constitution in the result display control unit.

FIG. 8 illustrates an example of the program constitution in the result display control unit 36. As illustrated in the figure, the result display control unit 36 includes a window manager 70, an event process 71, a stream window display process 72, a free-format window display process 73, a display time change process 74, a signal terminal display process 75, a display color change process 76, a FIND command process 77, and a mode switch process 78.

FIGS. 9 to 16 show the flows of processings executed by the respective processes provided in the result display control unit 36. Hereinafter, the processings to be executed are explained in detail according to the respective flows.

Figure 9:
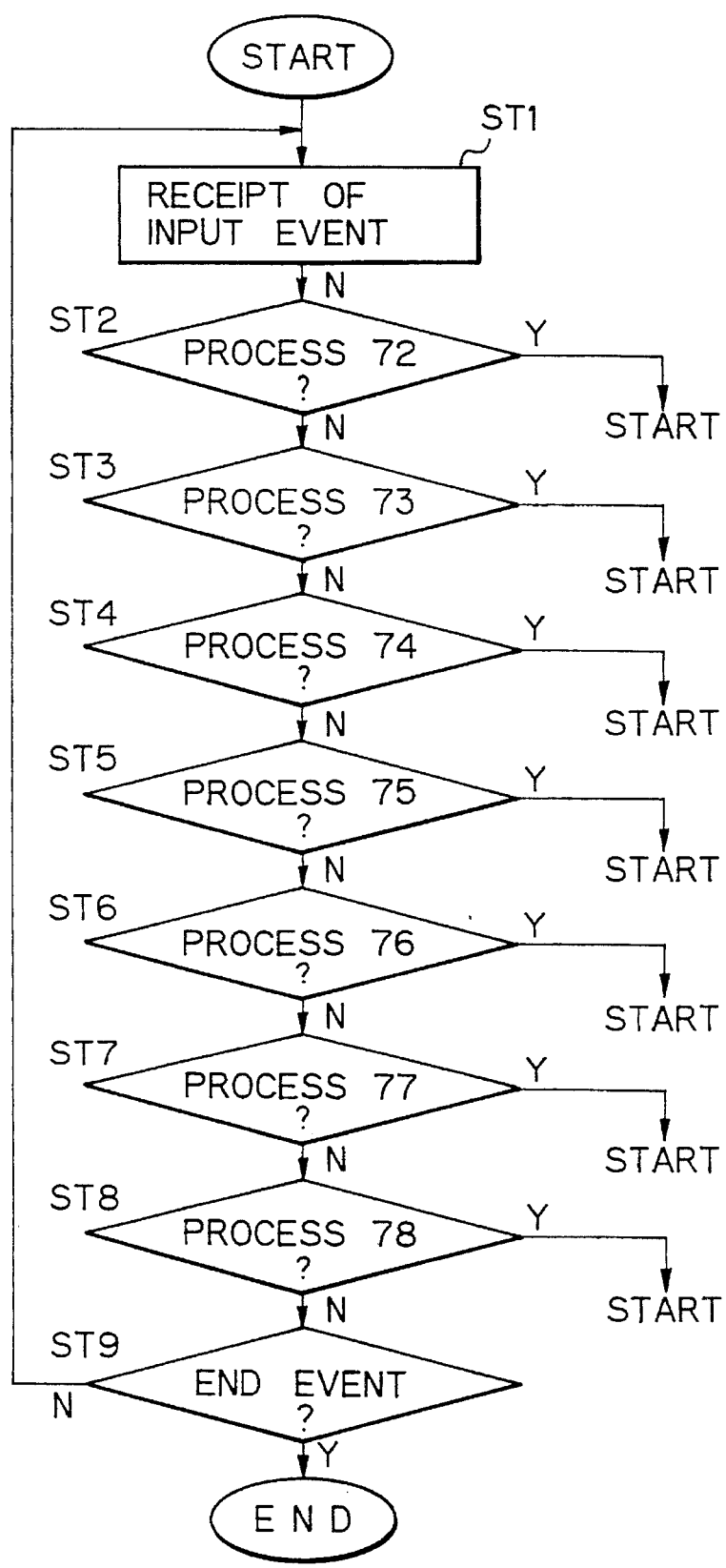
FIG. 9 is a flowchart representing an example of the processing executed by the event process.

As shown in the flowchart of FIG. 9, first at step ST1, the event process 71 executes a receipt processing of an input event when the input event is input from the terminal 2 into the unit 36. Next, at step ST2, the event process 71 judges whether the input event is an event indicating the start of the stream window display process 72 (Y) or not (N). Where a result of the judgement indicates "Y", the event process 71 starts the stream window display process 72, and where a result of the judgement indicates "N", the event process 71 proceeds to step ST3. At step ST3, the event process 71 judges whether the input event is an event indicating the start of the free-format window display process 73 (Y) or not (N), and where a result of the judgement indicates "Y", the event process 71 starts the free-format window display process 73.

On the other hand, where a result of the judgement at step ST3 indicates "N", the event process 71 proceeds to step ST4. At step ST4, the event process 71 judges whether the input event is an event indicating the start of the display time change process 74 (Y) or not (N). Where a result of the judgement indicates "Y", the event process 71 starts the display time change process 74, and where a result of the judgement indicates "N", the event process 71 proceeds to step ST5. At step ST5, the event process 71 judges whether the input event is an event indicating the start of the signal terminal display process 75 (Y) or not (N), and where a result of the judgement indicates "Y" the event process 71 starts the signal terminal display process 75.

On the other hand, where a result of the judgement at step ST5 indicates "N", the event process 71 proceeds to step ST6. At step ST6, the event process 71 judges whether the input event is an event indicating the start of the display color change process 76 (Y) or not (N). Where a result of the judgement indicates "Y", the event process 71 starts the display color change process 76, and where a result of the judgement indicates "N", the event process 71 proceeds to step ST7. At step ST7, the event process 71 judges whether the input event is an event indicating the start of the FIND command process 77 (Y) or not (N), and where a result of the judgement indicates "Y", the event process 71 starts the FIND command process 77.

On the other hand, where a result of the judgement at step ST7 indicates "N", the event process 71 proceeds to step ST8. At step ST8, the event process 71 judges whether the input event is an event indicating the start of the mode switch process 78 (Y) or not (N). Where a result of the judgement indicates "Y", the event process 71 starts the mode switch process 78, and where a result of the judgement indicates "N", the event process 71 proceeds to step ST9. At step ST9, the event process 71 judges whether the input event is an end event indicating the end of processing (Y) or not (N). Where a result of the judgement indicates "Y", the event process 71 comes to an "END", and where a result of the judgement indicates "N", the event process 71 returns to step ST1.

Thus, according to the flowchart shown in FIG. 9, the event process 71 executes processings for starting the respective processes indicated by the input event.

Figure 10:
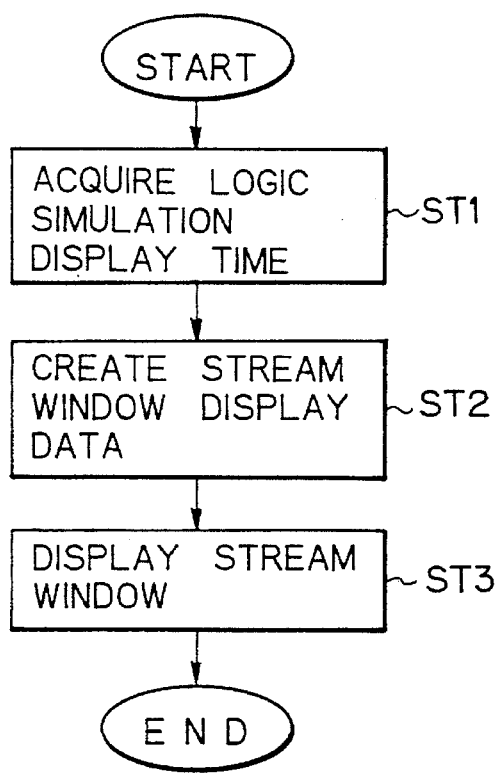
FIG. 10 is a flowchart representing an example of the processing executed by the stream window display process.

As shown in the flowchart of FIG. 10, when the stream window display process 72 is started by the event process 71, first at step ST1, it reads a logic simulation display time indicating the present display time from the time management table 44. Next, at step ST2, the stream window display process 72 sets the read logic simulation display time as the standard time, and creates a stream window display data. Namely, the stream window display process 72 creates the stream window display data by adapting time-series data of signal values, lying around the read logic simulation display time, in the signal value table 43, to the display format of a stream window designated by the stream window management table 42.

Next, at step ST3, the stream window display process 72 displays the created stream window display data in a stream window allocated by the window allocation unit 35. Thus, the stream window 52 as shown in FIG. 6 is displayed. At this time, with respect to the logic simulation display time portion in the time display part 56 and the signal value portion in the signal value display part 57, corresponding to the logic simulation display time, the stream window display process 72 displays the same in a changed color.

Figure 11:
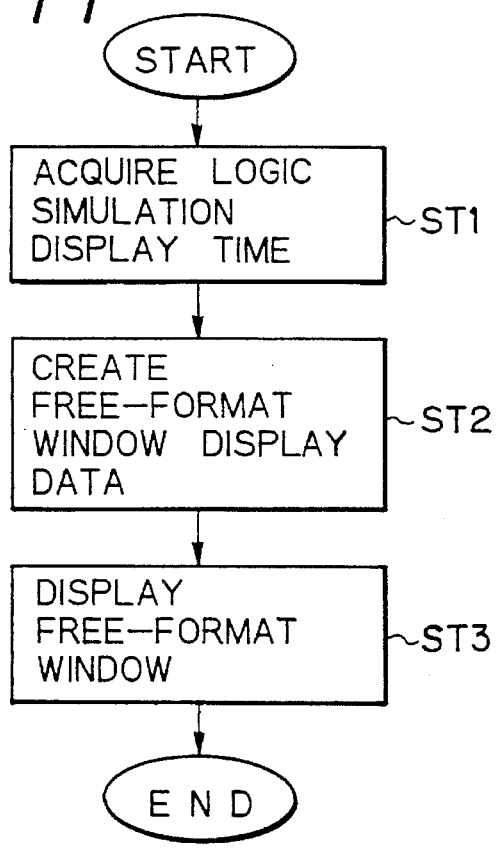
FIG. 11 is a flowchart representing an example of the processing executed by the free-format window display process.

On the other hand, as shown in the flowchart of FIG. 11, when the free-format window display process 73 is started by the event process 71, first at step ST1, it reads a logic simulation display time indicating the present display time from the time management table 44. Next, at step ST2, the free-format window display process 73 sets the read logic simulation display time as the standard time, and creates a free-format window display data. Namely, the free-format window display process 73 creates the free-format window display data by adapting signal value data, at the read logic simulation display time, in the signal value table 43, to the display format of a free-format window designated by the free-format window management table 41.

Next, at step ST3, the free-format window display process 73 displays the created free-format window display data in free-format windows allocated by the window allocation unit 35. Thus, the free-format windows 50, 51 as shown in FIG. 6 are displayed.

Accordingly, using the above stream window display process 72 and the free-format window display process 73, it is possible to display both the logic simulation result information according to the stream display format and the logic simulation result information according to the free-format display format, simultaneously on the display of the terminal 2.

Figure 12:
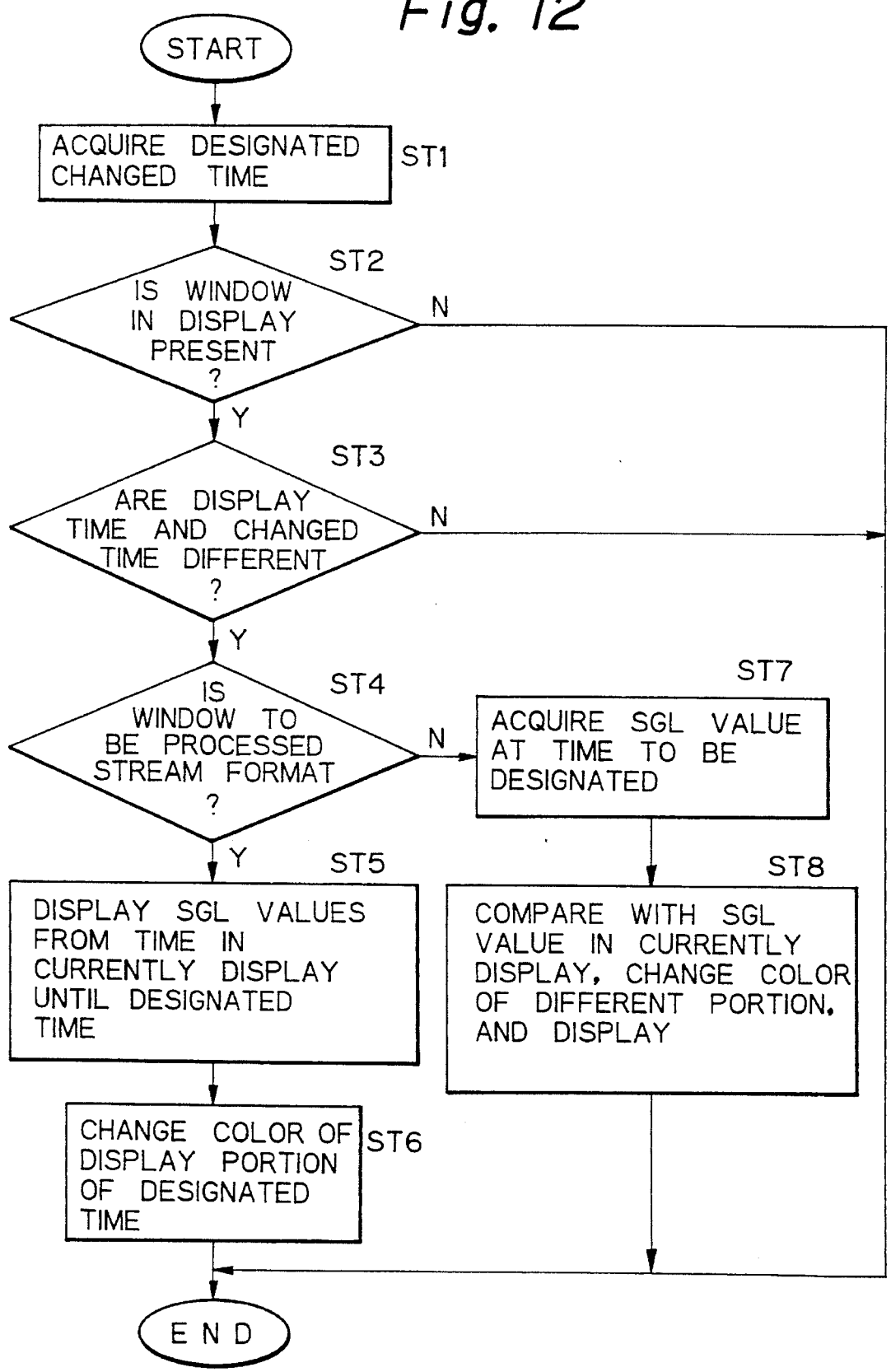
FIG. 12 is a flowchart representing an example of the processing executed;by the display time change process.

As shown in the flowchart of FIG. 12, when the display time change process 74 is started by the event process 71, first at step ST1, it acquires a designated changed time which is to be a new logic simulation display time. Next, at step ST2, the display time change process 74 judges whether any window which is being displayed on the display is present (Y) or not (N). Where a result of the judgement indicates "N", the display time change process 74 comes to an "END", and where a result of the judgement indicates "Y", the display time change process 74 proceeds to step ST3. At step ST3, the display time change process 74 judges whether the logic simulation display time in currently display and the changed logic simulation display time are different (Y) or not (N).

Where a result of the judgement at step ST3 indicates "N", the display time change process 74 comes to an "END", and where a result of the judgement indicates "Y", the display time change process 74 proceeds to step ST4. At step ST4, the display time change process 74 updates the logic simulation display time in the time management table 44, and judges whether a window or windows to be processed, i.e., a window or windows in currently display, is a window of a stream display format (Y) or not (N). Where a result of the judgement indicates "Y", the display time change process 74 proceeds to step ST5. At step ST5, the display time change process 74 reads signal values from the logic simulation display time in currently display until the designated new logic simulation display time, from the signal value table 43, and displays the signal values. Next, at step ST6, the display time change process 74 changes the color of a display portion of the designated new logic simulation display time, and displays the color-changed logic simulation display time.

On the other hand, where a result of the judgement at step ST4 indicates "N", i.e., where the display time change process 74 judges that a window or windows to be processed is a window of a free-format display format, the display time change process 74 proceeds to step ST7. At step ST7, the display time change process 74 acquires a signal value at a new logic simulation display time from the signal value table 43. Next, at step ST8, the display time change process 74 compares the acquired signal value with the signal value in currently display, and thus changes the color only with respect to a different portion, and displays the same.

Thus, according to the display time change process 74, the logic simulation display time is updated to one designated by a user. Also, a display portion of the present logic simulation display time in the stream window is displayed in a changed color. Furthermore, a signal value portion changed by the updating of the logic simulation display time, among signal values in the free-format window, is displayed in a changed color.

Figure 13A:
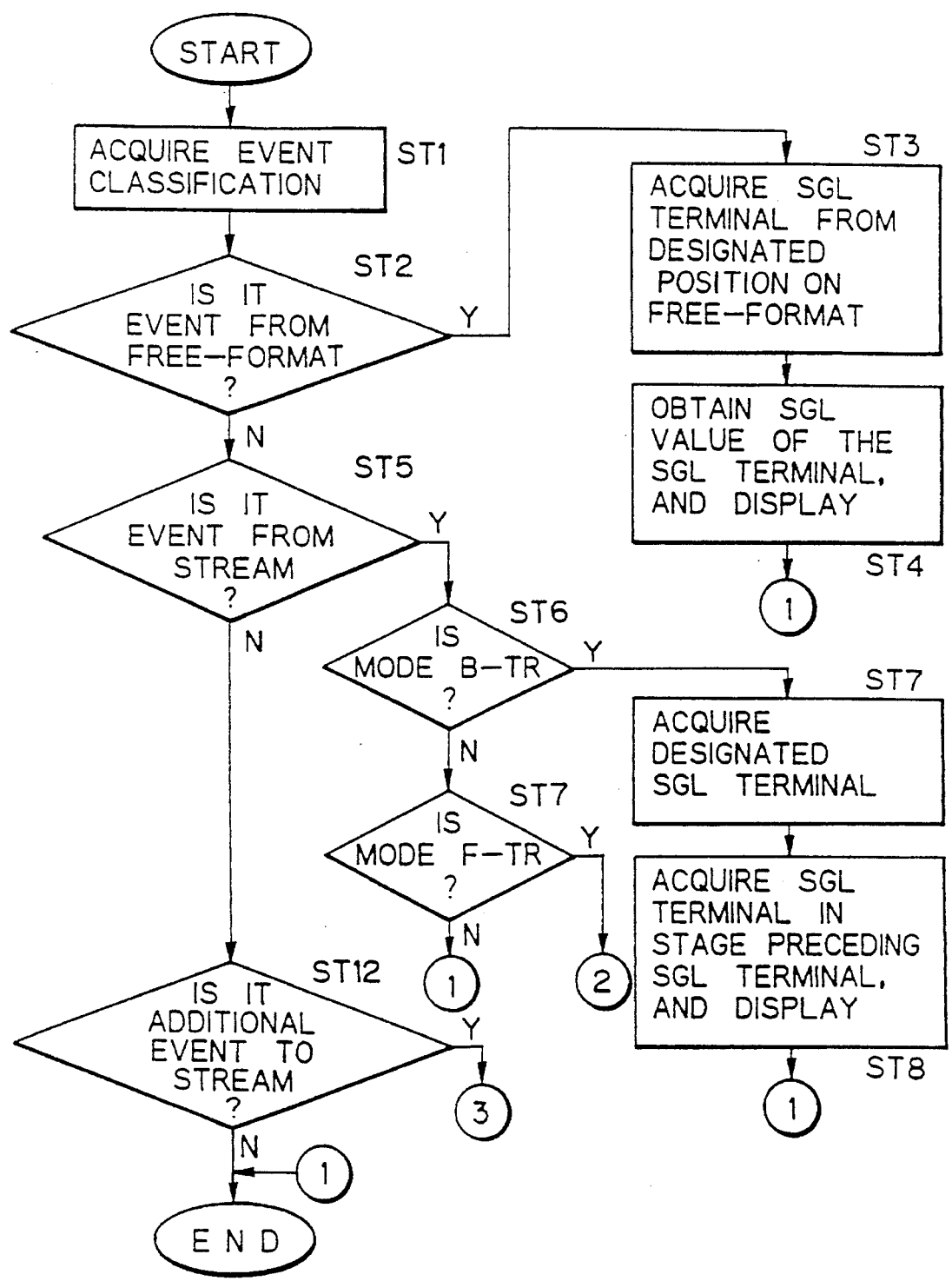
Figure 13B:
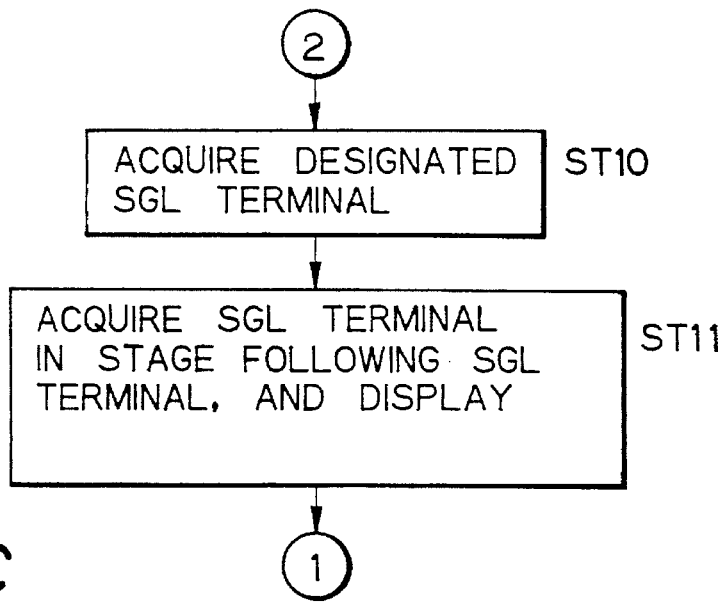
Figure 13C:
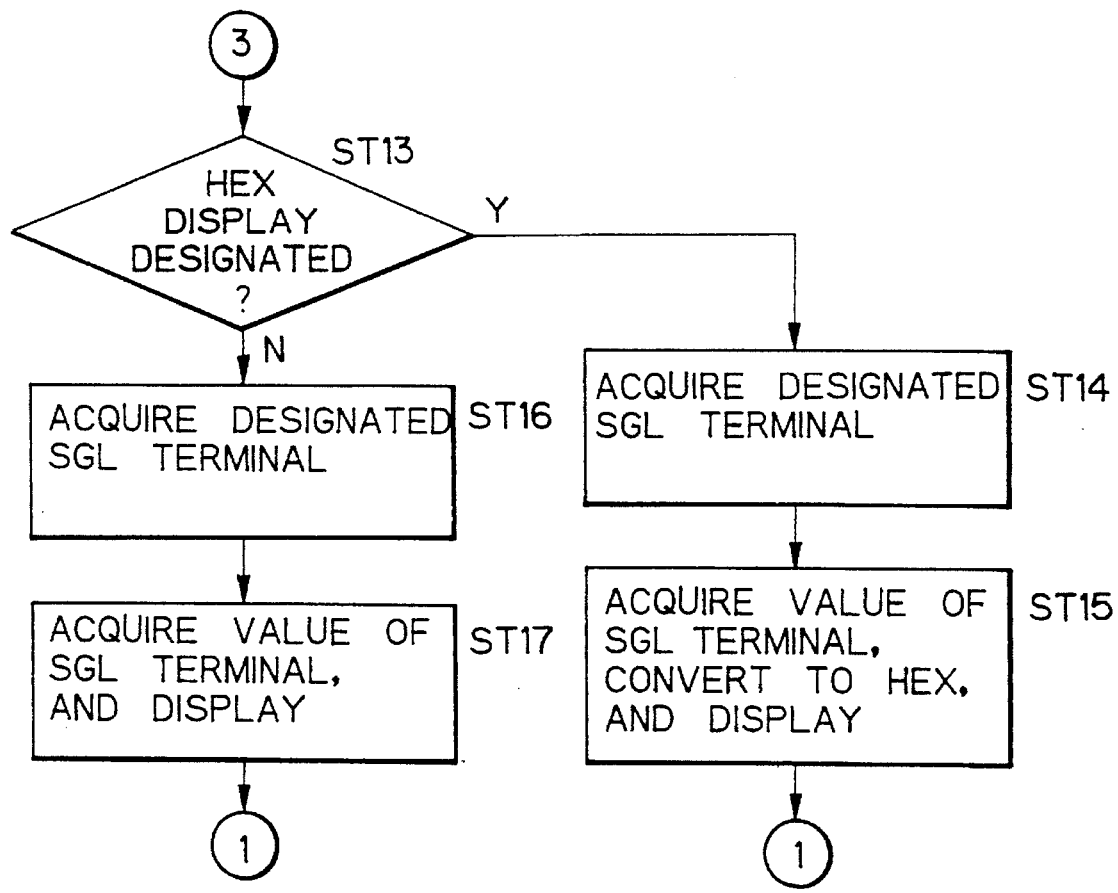

As shown in the flowcharts of FIGS. 13A to 13C, when the signal terminal display process 75 is started by the event process 71, first at step ST1, it acquires an event classification. Next, at step ST2, the signal terminal display process 75 judges from the acquired event classification whether it is an event from a free-format window (Y) or not (N). Where a result of the judgement indicates "Y", i.e., where the signal terminal display process 75 judges that it is an event from a free-format window, the signal terminal display process 75 proceeds to step ST3. At step ST3, the signal terminal display process 75 acquires a signal terminal to be displayed, from the position of a designated signal value in a free-format window. Next, at step ST4, the signal terminal display process 75 registers the acquired signal terminal in the stream window management table 42, and thus reads time-series data of signal values for the acquired signal terminal, from the signal value table 43. Then, the signal terminal display process 75 additionally displays the read data in a stream window on the display, and thus terminates the processing. At this time, with respect to the additionally displayed signal values, the signal terminal display process 75 displays the same in a changed color.

On the other hand, where a result of the judgement at step ST2 indicates "N", i.e. where the signal terminal display process 75 judges that it is not an event from a free-format window, the signal terminal display process 75 proceeds to step ST5. At step ST5, the signal terminal display process 75 judges whether it is an event from a stream window (Y) or not (N). Where a result of the judgement indicates "Y", i.e. where the signal terminal display process 75 judges that it is an event from a stream window, the signal terminal display process 75 proceeds to step ST6. At step ST6, the signal terminal display process 75 judges whether the present mode is set to a back-trace mode (which is defined as the inverse direction to the flow of signals) according to the mode switch process 78 stated later (Y) or not (N).

Where a result of the judgement at step ST6 indicates "Y", i.e., where the signal terminal display process 75 judges that the present mode is set to a back-trace mode, the signal terminal display process 75 proceeds to step ST7. At step ST7, the signal terminal display process 75 acquires a designated signal terminal from the position of the designated signal terminal in a stream window. Next, at step ST8, the signal terminal display process 75 retrieves the logic circuit data file 33, and thus acquires one or a plurality of signal terminals lying in a stage preceding the above acquired signal terminal. Then, the signal terminal display process 75 registers the acquired one or a plurality of signal terminals in the stream window management table 42, and thus reads time-series data of signal values for the acquired signal terminals, from the signal value table 43. Then, the signal terminal display process 75 additionally displays the read data in a stream window on the display, and thus terminates the processing. At this time, with respect to the additionally displayed signal values, the signal terminal display process 75 displays the same in a changed color.

On the other hand, where a result of the judgement at step ST6 indicates "N", i.e., where the signal terminal display process 75 judges that the present mode is not set to a back-trace mode, the signal terminal display process 75 proceeds to step ST9. At step ST9, the signal terminal display process 75 judges whether the present mode is set to a forward-trace mode (which is defined as the same direction as the flow of signals) according to the mode switch process 78 stated later (Y) or not (N). Where a result of the judgement indicates "Y", the signal terminal display process 75 proceeds to step ST10, and where a result of the judgement indicates "N", the signal terminal display process 75 comes to an "END". At step ST10, the signal terminal display process 75 acquires a designated signal terminal from the position of the designated signal terminal in a stream window. Next, at step ST11, the signal terminal display process 75 retrieves the logic circuit data file 33, and thus acquires one or a plurality of signal terminals lying in a stage following the above acquired signal terminal. Then, the signal terminal display process 75 registers the acquired one or a plurality of signal terminals in the stream window management table 42, and thus reads time-series data of signal values for the acquired signal terminals, from the signal value table 43. Then, the signal terminal display process 75 additionally displays the read data in a stream window on the display, and thus terminates the processing. At this time, with respect to the additionally displayed signal values, the signal terminal display process 75 displays the same in a changed color.

On the other hand, where a result of the judgement at step ST5 indicates "N", i.e., where the signal terminal display process 75 judges that it is not an event from a stream window, the signal terminal display process 75 proceeds to step ST12. At step ST12, the signal terminal display process 75 judges whether it is an additional event to a stream window (Y) or not (N). Where a result of the judgement indicates "Y", the signal terminal display process 75 proceeds to step ST13, and where a result of the judgement indicates "N", the signal terminal display process 75 comes to an "END". At step ST13, the signal terminal display process 75 judges whether a hexadecimal display is designated (Y) or not (N).

Where a result of the judgement at step ST13 indicates "Y", i.e., where the signal terminal display process 75 judges that a hexadecimal display is designated, the signal terminal display process 75 proceeds to step ST14. At step ST14, the signal terminal display process 75 acquires a signal terminal designated from the terminal 2, and registers the acquired signal terminal in the stream window management table 42. Next, at step ST15, the signal terminal display process 75 reads time-series data of signal values for the registered signal terminal, from the signal value table 43, and converts the data into a hexadecimal value. Then, the signal terminal display process 75 additionally displays the converted data in a stream window on the display, and thus terminates the processing. On the other hand, where a result of the judgement at step ST13 indicates "N", i.e. where the signal terminal display process 75 judges that a binary display is designated, the signal terminal display process 75 proceeds to step ST16. At step ST16, the signal terminal display process 75 acquires a signal terminal designated from the terminal 2, and registers the acquired signal terminal in the stream window management table 42. Next, at step ST17, the signal terminal display process 75 reads time-series data of signal values for the registered signal terminal, from the signal value table 43. Then, the signal terminal display process 75 additionally displays the read data in a stream window on the display, and thus terminates the processing.

Thus, according to the signal terminal display process 75, from a designation of a signal terminal in a free-format window, it is possible to display time-series data of signal values for the signal terminal, in a stream window. Also, from a designation of a signal terminal in a stream window, it is possible to display time-series data of signal values for signal terminals, which have influences on the signal terminal and exist in a stage preceding or following the signal terminal, in a stream window.

Figure 14:
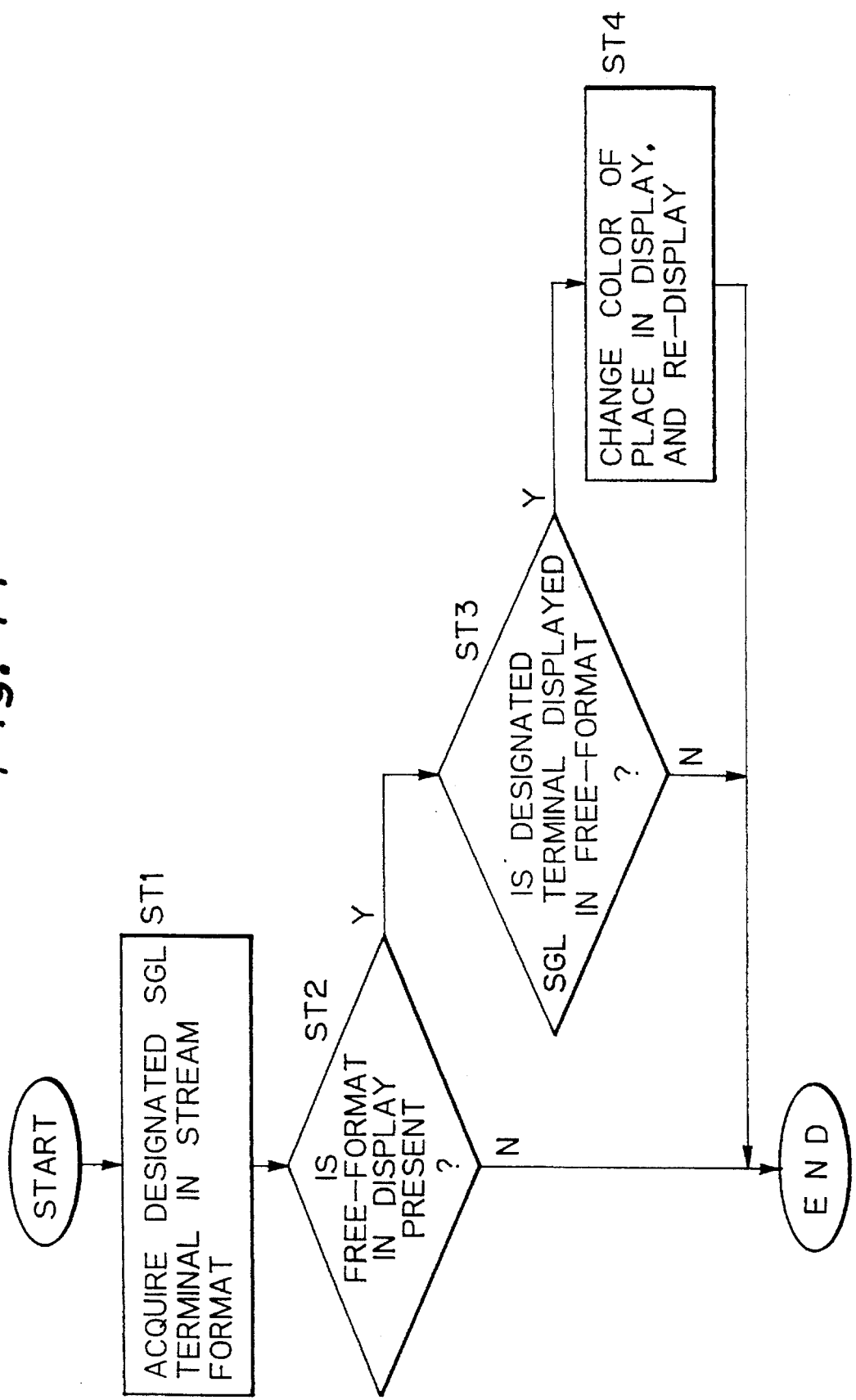
FIG. 14 is a flowchart representing an example of the processing executed by the display color change process.

As shown in the flowchart of FIG. 14, when the display color change process 76 is started by the event process 71, first at step ST1, it acquires a designated signal terminal from the position of the designated signal terminal in a stream window. Next, at step ST2, the display color change process 76 judges whether a free-format window in display is present (Y) or not (N), and where a result of the judgement indicates "N", the display color change process 76 comes to an "END".

On the other hand, where a result of the judgement at step ST2 indicates "Y", i.e., where the display color change process 76 judges that a free-format window in display is present, the display color change process 76 proceeds to step ST3. At step ST3, the display color change process 76 judges whether the designated signal terminal is registered in the free-format window management table 41 (Y) or not (N). Where a result of the judgement indicates "Y", the display color change process 76 proceeds to step ST4, and where a result of the judgement indicates "N", the display color change process 76 comes to an "END". At step ST4, the display color change process 76 changes the color of a signal value portion of the designated signal terminal which is displayed in the free-format window, and re-displays the color-changed portion.

Thus, according to the display color change process 76, from a designation of a signal terminal in a stream window, it is possible to display a signal value for the signal terminal in a changed color when the signal value is displayed in a free-format window.

Figure 15:
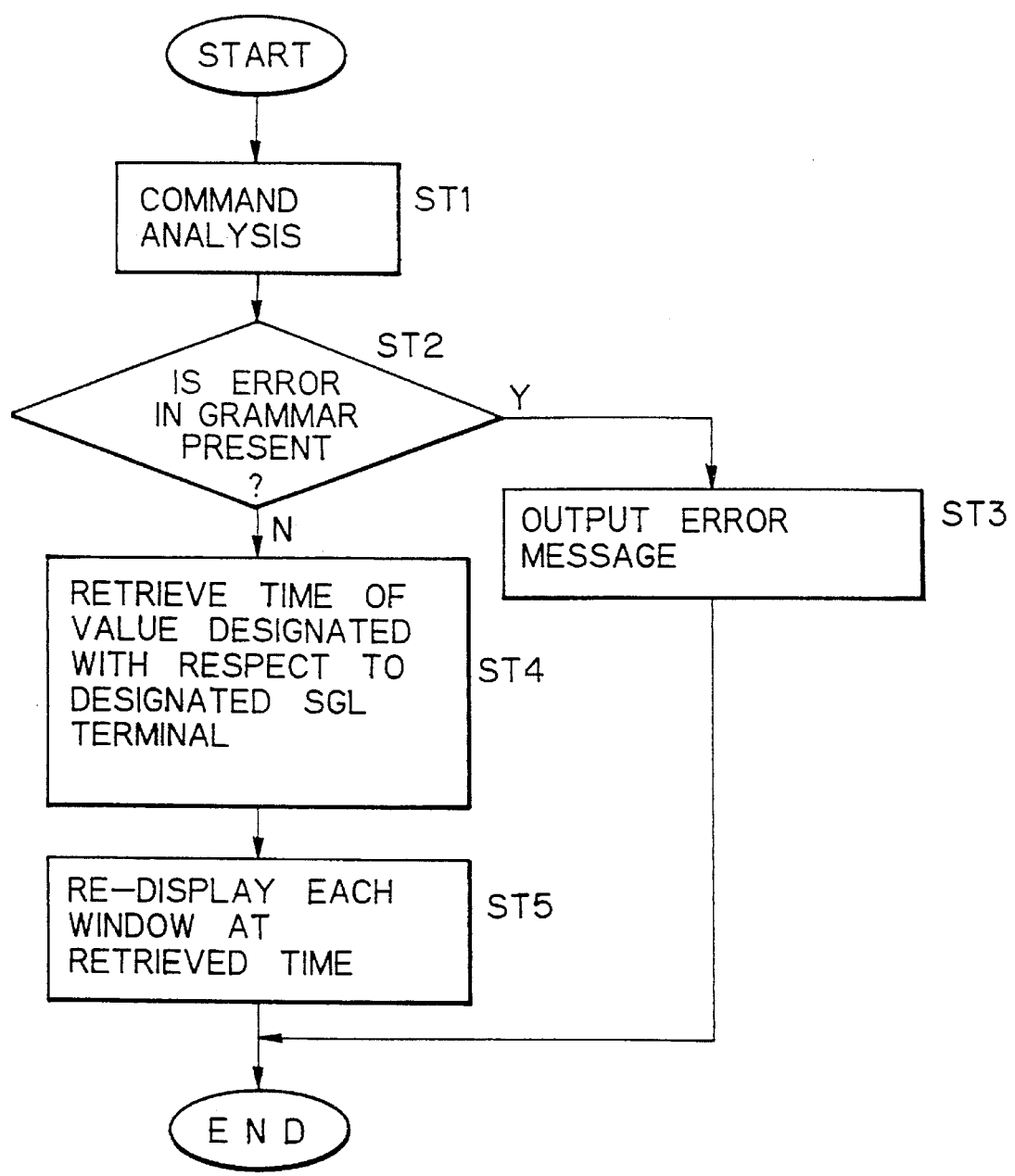
FIG. 15 is a flowchart representing an example of the processing/executed by the FIND command process.

As shown in the flowchart of FIG. 15, when the FIND command process 77 is started by the event process 71, first at step ST1, it executes a command analysis of FIND commands input from the terminal 2. Next, at step ST2, the FIND command process 77 judges from the analysis whether an error in grammar is present (Y) or not (N) Where a result of the judgement indicates "Y" the FIND command process 77 proceeds to step ST3, where it outputs an error message and thus terminates the processing. Namely, when a FIND command "FIND 'DATA'=H '3' ", which indicates retrieval of a time at which a signal terminal defined as "DATA" corresponds to a hexadecimal signal value of "3" is input, the FIND command process 77 executes an analysis of the FIND command, and outputs an error message where an error in grammar is present.

On the other hand, where a result of the judgement at step ST2 indicates "N", i.e. where the FIND command process 77 judges that an error in grammar is not present, the FIND command process 77 proceeds to step ST4. At step ST4, the FIND command process 77 retrieves the signal value table 43 to thereby retrieve a time which satisfies a designation condition of the FIND command. Next, at step ST5, the FIND command process 77 registers the retrieved time in a logic simulation display time of the time management table 44, updates the logic simulation display time, and thus re-displays both the stream window and the free-format window at the retrieved time.

Thus, according to the FIND command process 77, it is possible to set the time, which satisfies a designation condition of the FIND command, as the logic simulation display time, and thus to update the display data of the stream window and the free-format window.

Figure 16:
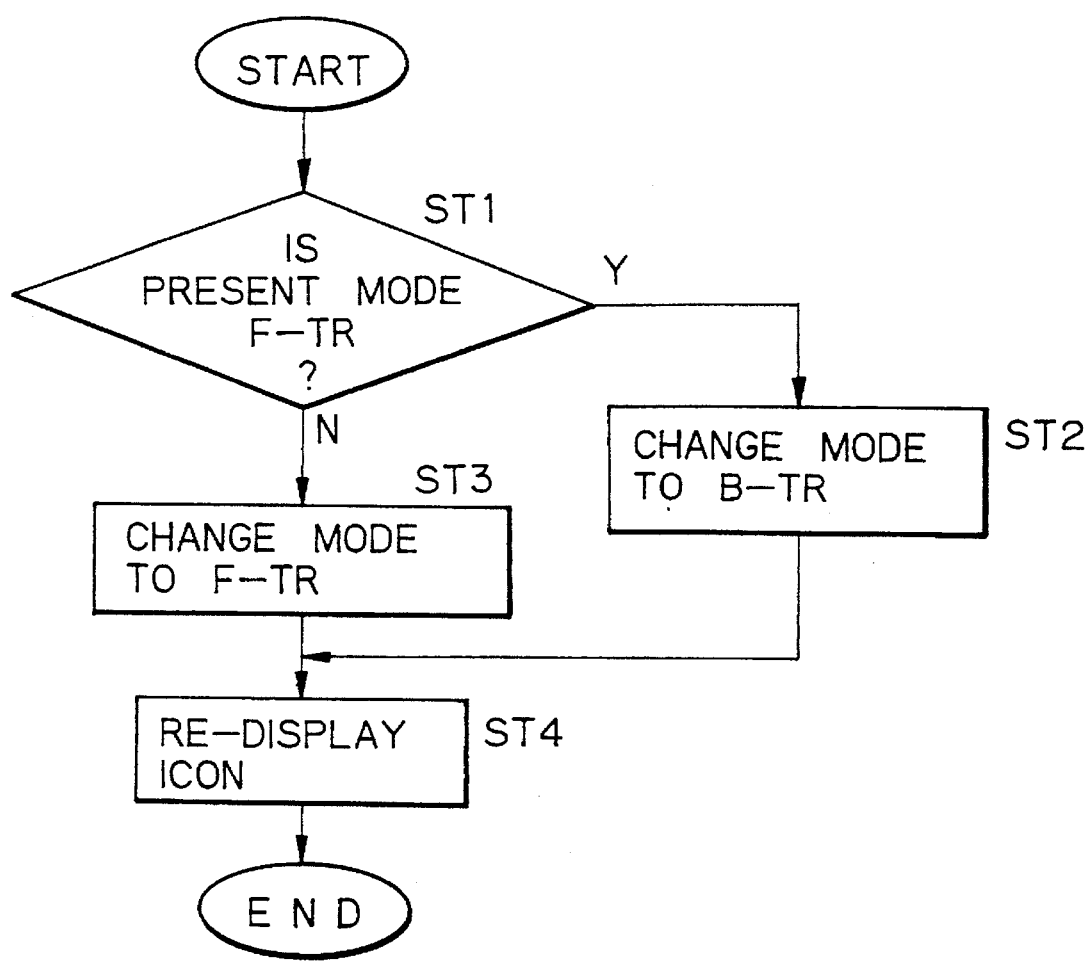
FIG. 16 is a flowchart representing an example of the processing executed by the mode switch process.

As shown in the flowchart of FIG. 16, when the mode switch process 78 is started by the event process 71, first at step ST1, it judges whether the present mode is a forward-trace mode (Y) or not (N). Where a result of the judgement indicates "Y", i.e., where the mode switch process 78 judges that the present mode is a forward-trace mode, the mode switch process 78 proceeds to step ST2, where it changes the mode to a back-trace mode. On the other hand, where a result of the judgement at step ST1 indicates "N", i.e., where the mode switch process 78 judges that the present mode is a back-trace mode, the mode switch process 78 proceeds to step ST3, where it changes the mode to a forward-trace mode. After completion of the respective processings at steps ST2 and ST3, the mode switch process 78 proceeds to step ST4, where it re-displays the icon part 53 and thus terminates the processing.

Thus, according to the mode switch process 78, it is possible to select a mode required for the processing of the signal terminal display process 75.

Next, examples of the display processing of logic simulation result information will be concretely explained with reference to FIGS. 17 to 21.

Figure 17:
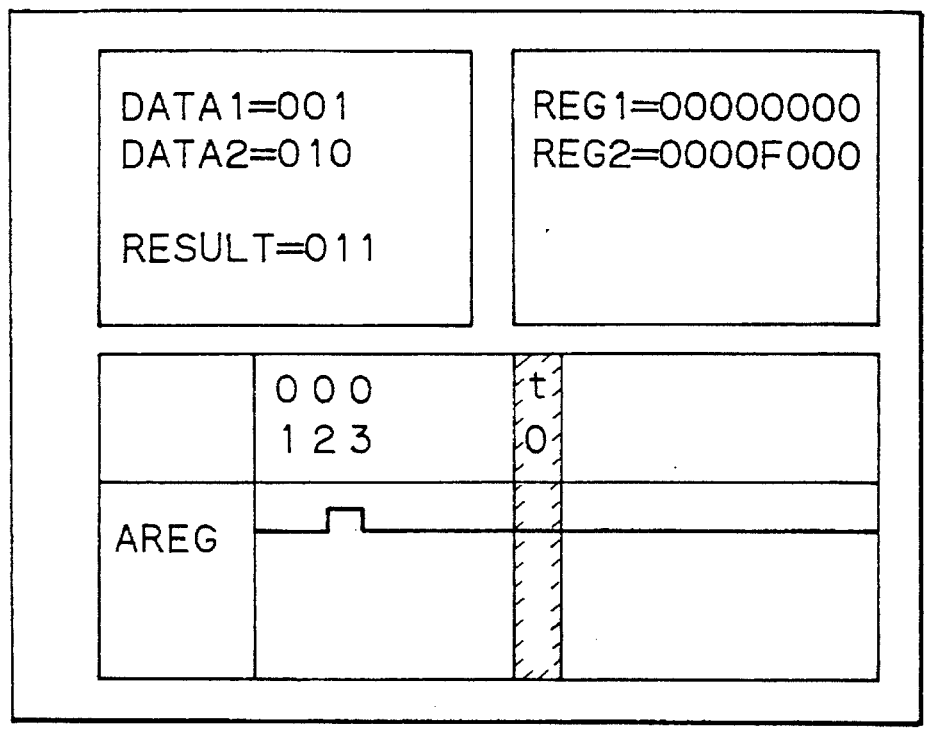
FIG. 17 is a diagram illustrating a first example of the display processing of logic simulation result information.
Figure 18:
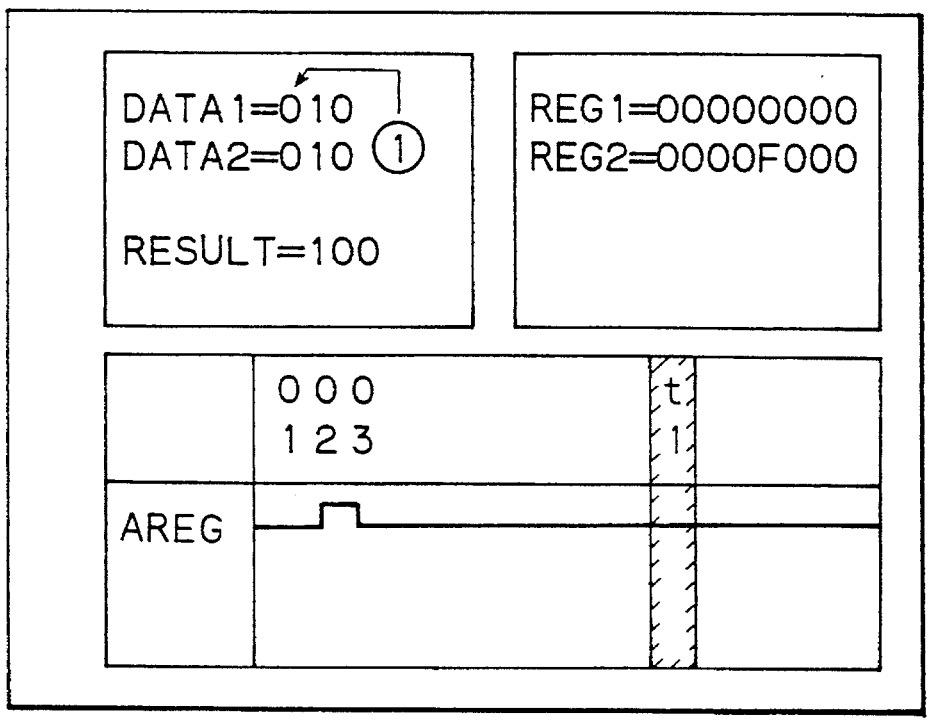
FIG. 18 is a diagram illustrating a second example of the display processing of logic simulation result information.

In the case where a logic simulation result information as shown in FIG. 17, in which the logic simulation display time is "t0", is displayed on the display of the terminal 2, when a user designates a logic simulation time "t1" through the input unit 3, a logic simulation result information as shown in FIG. 18, in which the logic simulation display time is "t1", is displayed on the display. At this time, where a change occurs in a signal value in the free-format window as shown by ① in FIG. 18, the color of the signal value portion is changed.

In the case where the logic simulation result information as shown in FIG. 18 is displayed, when a user designates a signal value of ① through the input unit 3, time-series data of signal values for a signal terminal indicated by the signal value are displayed in the stream window, as shown in FIG. 19. Namely, as shown by ② in FIG. 19, the time-series data of signal values for a signal terminal in the free-format window designated by the user are displayed in the stream window.

In the case where the logic simulation result information as shown in FIG. 19 is displayed, when a user designates a signal terminal of ② the input unit 3 (Note, when the back-trace mode is set), time-series data of signal values for a signal terminal in the preceding stage side connected to the signal terminal are displayed in the stream window, as shown in FIG. 20. Namely, as shown by ③ in FIG. 20, the time-series data of signal values for a signal terminal in the preceding stage side connected to the signal terminal in the stream window designated by the user are displayed in the stream window.

On the other hand, in the case where the logic simulation result information as shown in FIG. 19 is displayed, when a user designates a signal terminal of ③ through the input unit 3 (Note, when the forward-trace mode is set), time-series data of signal values for a signal terminal in the following stage side connected to the signal terminal are displayed in the stream window, as shown in FIG. 21. Namely, as shown by ④ in FIG. 21, the time-series data of signal values for a signal terminal in the following stage side connected to the signal terminal in the stream window designated by the user are displayed in the stream window.

Although, in the above embodiment, it is so constituted that the display color is changed to thereby call a user's attention to the display, the present invention is not restrictive thereto. For example, other constitution of changing the brightness of display, or of flickering the display, may be adopted.

Although the present invention has been disclosed and described by way of one embodiment, it is apparent to those skilled in the art that other embodiments and modifications of the present invention are possible without departing from the spirit or essential features thereof.

We claim:

1. A logic simulation system which simulates logic circuits to thereby display logic simulation result information on a display, the logic simulation system comprising:

a first management table for managing time-series data of signal values for each of a plurality of signal terminals, the time-series data constituting logic simulation result information;

setting means for setting one display format or a plurality of display formats for logic simulation result information, permitting a desired display format, through an interactive communication with users;

a second management table for managing a free-format display format set by the setting means;

a third management table for managing a stream display format which is a time-series display format of logic simulation result information; and result display control means for specifying logic simulation result information at a present display time in the free-format display format with reference to management data in the first management table and management data in the second management table, thereby to display the specified logic simulation result information on the display, and for specifying logic simulation result information, including the present display time, in the stream display format with reference to the management data in the first management table and management data in the third management table, thereby to display the specified logic simulation result information on the display.

2. A logic simulation system as set forth in claim 1, further comprising changing means for changing the present display time through an interactive communication with users.

3. A logic simulation system as set forth in claim 1, further comprising:

retrieving means for retrieving the management data in the first management table and thus retrieving a logic simulation time, to a value at which a signal value for a designated signal terminal is changed; and time setting means for setting the logic simulation time retrieved by the retrieving means, as the present display time.

4. A logic simulation system as set forth in claim 1, wherein the result display control means receives and implements a process of displaying logic simulation result information of the stream display logic simulation result information of the stream display format in a display format by which the present display time is distinguishable.

5. A logic simulation system as set forth in claim 1, wherein, when the present display time is changed, the result display control means receives and implements a process of displaying a portion at which a change in signal values occurs in the free-format display format, in a display format by which the portion is distinguishable.

6. A logic simulation system as set forth in claim 1, wherein the result display control means receives and implements a process of displaying signal values of logic simulation result information, by hexadecimal, to thereby collectively display signal values for a plurality of signal terminals.

7. A logic simulation system as set forth in claim 1, further comprising:

selecting means for selecting a signal value from the free-format display format, through an interactive communication with users;

registering means for registering a signal terminal indicated by a signal value, selected by the selecting means, in the third management table; and the result display control means receives and implements a process of displaying the time-series logic simulation result information of the signal terminal registered by the registering means, in the stream display format on the display.

8. A logic simulation system as set forth in claim 7, wherein the result display control means receives and implements a process of displaying signal values of the stream display format of the signal terminal registered by the registering means, in a display format by which the signal values are distinguishable.

9. A logic simulation system as set forth in claim 1, further comprising:

selecting means for selecting a signal terminal from the stream display format, through an interactive communication with users;

judging means for judging whether or not the signal terminal selected by the selecting means is registered in the second management table; and wherein, when the judging means judges that the signal terminal selected by the selecting means is registered in the second management table, the result display control means receives and implements a process of displaying signal values of the free-format display format of the signal terminal selected by the selecting means, in a display format by which the signal values are distinguishable.

10. A logic simulation system as set forth in claim 1, further comprising:

designating means for designating a signal terminal from the stream display format, through an interactive communication with users;

direction selecting means for selecting either a preceding stage direction or a following stage direction, through an interactive communication with users;

specifying means for referring to logic circuit data information which is an object of logic simulation, specifying one signal terminal or a plurality of signal terminals which are related to a signal terminal designated by the designating means and which pertain to a direction selected by the direction selecting means, and registering the specified signal terminals in the third management table; and the result display control means receiving and implement a process of displaying a time-series logic simulation result information of the signal terminals specified by the specifying means, in the stream display format on the display.

11. A logic simulation system as set forth in claim 10, wherein the result display control means receives and implements a process of displaying signal values of the stream display format of the signal terminals specified by the specifying means, in a display format by which the signal values are distinguishable.

12. A logic simulation system as set forth in claim 10, further comprising;

judging means for judging whether or not the signal terminals specified by the specifying means are registered in the second management table; and when the judging means judges that the signal terminals specified by the specifying means are registered in the second management table, the result display control means receives and implements a process of displaying signal values of the free-format display format of the signal terminals specified by the specifying means, in a display format by which the signal values are distinguishable.

13. A logic simulation system which simulates logic circuits to thereby display logic simulation result information on a display, the logic simulation system comprising:

a first management table for managing time-series data of signal values for each of a plurality of signal terminals, which time-series data constituting logic simulation result information;

setting means for setting one display format or a plurality of display formats for logic simulation result information, permitting a display format, through an interactive communication with users;

a second management table for managing a free-format display format set by the setting means;

a third management table for managing a stream display format which is a time-series display format of logic simulation result information;

result display control means for specifying logic simulation result information at a present display time in the free-format display format with reference to management data in the first management table and management data in the second management table, thereby to display the specified logic simulation result information on the display, and for specifying logic simulation result information, including the present display time, in the stream display format with reference to the management data in the first management table and management data in the third management table, thereby to display the specified logic simulation result information on the display; and changing means for changing the present display time through an interactive communication with users.

* * * * *

UNITED STATES PATENT AND TRADEMARK OFFICE
CERTIFICATE OF CORRECTION

PATENT NO. : 5,563,993
DATED : Oct. 8, 1996
INVENTOR(S) : SATO et al.

It is certified that error appears in the above-indentified patent and that said Letters Patent is hereby corrected as shown below:

TITLE PAGE:

[54] Title, line 1, change "SIMULATOR" to --SIMULATION--.

[73] Assignee, before "Japan" insert --Kawasaki--.

[57] Abstract, line 7, delete "for".

Col 1, line 1, change "SIMULATOR" to --SIMULATION--.

Col. 2, line 40, change "FIGS. 4" to --FIGS. 4A--;
line 61, change "13D" to --13C--;
line 67, change "processing/executed" to --processing executed--.

Col. 5, line 42, after "display format" insert --,--.

Col. 9, line 2, after ""Y"" insert --,--.

Col. 13, line 35, after "(N)" insert --.--;
line 36, after ""Y"" insert --,--.

Col. 14, line 39, after "②" insert --through--.

Signed and Sealed this

Twenty-ninth Day of July, 1997

Attest:

BRUCE LEHMAN

Attesting Officer

Commissioner of Patents and Trademarks